(12) United States Patent
Shih et al.

(10) Patent No.: US 8,497,579 B1
(45) Date of Patent: Jul. 30, 2013

(54) SEMICONDUCTOR PACKAGING METHOD AND STRUCTURE THEREOF

(75) Inventors: Cheng-Hung Shih, Changhua County (TW); Shu-Chen Lin, Pingtung County (TW); Cheng-Fan Lin, Hsinchu County (TW); Yung-Wei Hsieh, Hsinchu (TW); Bo-Shiun Jiang, Taipei (TW)

(73) Assignee: Chipbond Technology Corporation, Hsinchu (TW)

( * ) Notice: Subject to any disclaimer, the term of this patent is extended or adjusted under 35 U.S.C. 154(b) by 7 days.

(21) Appl. No.: 13/398,081

(22) Filed: Feb. 16, 2012

(51) Int. Cl.
*H01L 23/48* (2006.01)

(52) U.S. Cl.
USPC .......... 257/737; 257/E23.021; 257/738; 257/778; 257/788; 257/789

(58) Field of Classification Search
USPC .......... 257/737, 738, 734, 778, 788, 789, 257/781, E23.021, 779
See application file for complete search history.

(56) References Cited

U.S. PATENT DOCUMENTS

| | | | | |
|---|---|---|---|---|
| 7,879,455 | B2* | 2/2011 | Kajiwara et al. | 428/620 |
| 2003/0049425 | A1* | 3/2003 | Ono et al. | 428/217 |
| 2003/0079680 | A1* | 5/2003 | Fukunaga et al. | 118/58 |
| 2004/0087057 | A1* | 5/2004 | Wang et al. | 438/106 |
| 2005/0028361 | A1* | 2/2005 | Yin et al. | 29/841 |
| 2006/0200985 | A1* | 9/2006 | Workman et al. | 29/860 |
| 2008/0023834 | A1* | 1/2008 | Chiu et al. | 257/738 |
| 2008/0251281 | A1* | 10/2008 | Buchwalter et al. | 174/255 |
| 2009/0008801 | A1* | 1/2009 | Lai et al. | 257/782 |
| 2009/0029504 | A1* | 1/2009 | Paik et al. | 438/108 |
| 2009/0294962 | A1* | 12/2009 | Hsu | 257/738 |
| 2009/0321778 | A1* | 12/2009 | Chen et al. | 257/99 |
| 2010/0155966 | A1* | 6/2010 | Moden | 257/783 |
| 2010/0230797 | A1* | 9/2010 | Honda | 257/687 |
| 2011/0012263 | A1* | 1/2011 | Hata et al. | 257/772 |
| 2012/0171368 | A1* | 7/2012 | Kamamori et al. | 427/126.3 |
| 2013/0026628 | A1* | 1/2013 | Pendse | 257/737 |
| 2013/0037947 | A1* | 2/2013 | Hayashi et al. | 257/737 |
| 2013/0050972 | A1* | 2/2013 | Mohammed et al. | 361/807 |

* cited by examiner

*Primary Examiner* — A O Williams
(74) *Attorney, Agent, or Firm* — Jackson IPG PLLC

(57) ABSTRACT

A semiconductor packaging method includes providing a substrate having a plurality of pads, each of the pads comprises a first coupling surface having a plurality of first conductive contact areas and a plurality of first non-conductive contact areas; forming a conductible gel with anti-dissociation function on the substrate, said conductible gel includes a plurality of conductive particles and a plurality of anti-dissociation substances; mounting a chip on the substrate, said chip comprises a plurality of copper-containing bumps, each of the copper-containing bumps comprises a ring surface and a second coupling surface having a plurality of second conductive contact areas and a plurality of second non-conductive contact areas, wherein the conductive particles are electrically connected with the first conductive contact areas and the second conductive contact areas, said anti-dissociation substances are in contact with the second non-conductive contact area, and the ring surfaces are covered with the anti-dissociation substances.

7 Claims, 2 Drawing Sheets

SEMICONDUCTOR PACKAGING METHOD AND STRUCTURE THEREOF

FIELD OF THE INVENTION

The present invention is generally related to a semiconductor packaging method, which particularly relates to the semiconductor packaging method that prevents copper ions from dissociation.

BACKGROUND OF THE INVENTION

Modern electronic products gradually lead a direction of light, thin, short, and small. Accordingly, the circuit layout for electronic products destines to develop technique such as "micro space between two electronic connection devices". However, a short phenomenon is easily occurred in mentioned circuit layout via an insufficient gap between two adjacent electronic connection devices.

SUMMARY

The primary object of the present invention is to provide a semiconductor packaging method includes providing a substrate having an upper surface and a plurality of pads disposed at the upper surface, and each of the pads comprises a first coupling surface having a plurality of first conductive contact areas and a plurality of first non-conductive contact areas; forming a conductible gel with anti-dissociation function on the upper surface and the pads of the substrate, wherein the conductible gel with anti-dissociation function includes a plurality of conductive particles and a plurality of anti-dissociation substances; mounting a chip on the substrate, the chip comprises an active surface facing toward the upper surface of the substrate and a plurality of copper-containing bumps disposed at the active surface, wherein the conductible gel with anti-dissociation function covers the copper-containing bumps, each of the copper-containing bumps comprises a second coupling surface and a ring surface, said second coupling surface comprises a plurality of second conductive contact areas and a plurality of second non-conductive contact areas, said copper-containing bumps are electrically connected with the pads via the conductive particles located between the first coupling surfaces and the second coupling surfaces, said conductive particles are electrically connected with the first conductive contact areas of the first coupling surfaces and the second conductive contact areas of the second coupling surfaces, wherein the anti-dissociation substances are located between adjacent conductive particles, each of the first coupling surfaces and each of the second coupling surfaces, said anti-dissociation substances are in contact with the second non-conductive contact areas of the second coupling surfaces, and the ring surfaces of the copper-containing bumps are covered with the anti-dissociation substances. As a result of the ring surfaces of the copper-containing bumps being covered by the anti-dissociation substances of the conductible gel with anti-dissociation function, when a dissociation phenomenon via copper ions from the copper-containing bumps is occurred, the anti-dissociation substances may capture those dissociated copper ions to avoid short phenomenon from happening.

DETAILED DESCRIPTION OF THE INVENTION

Figure 1A:
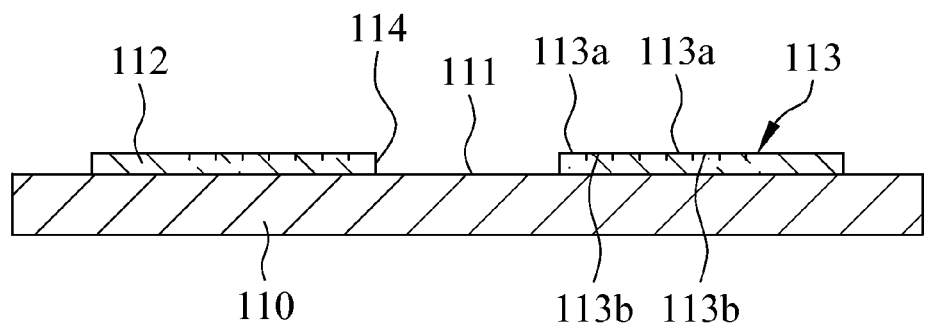
FIGS. 1A to 1C are section schematic diagrams illustrating a semiconductor packaging method in accordance with a preferred embodiment of the present invention.
Figure 1B:
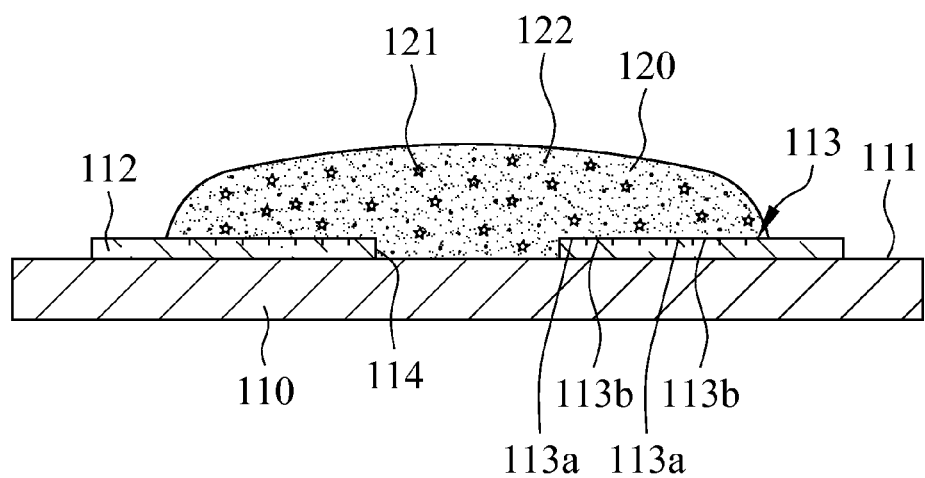
Figure 1C:
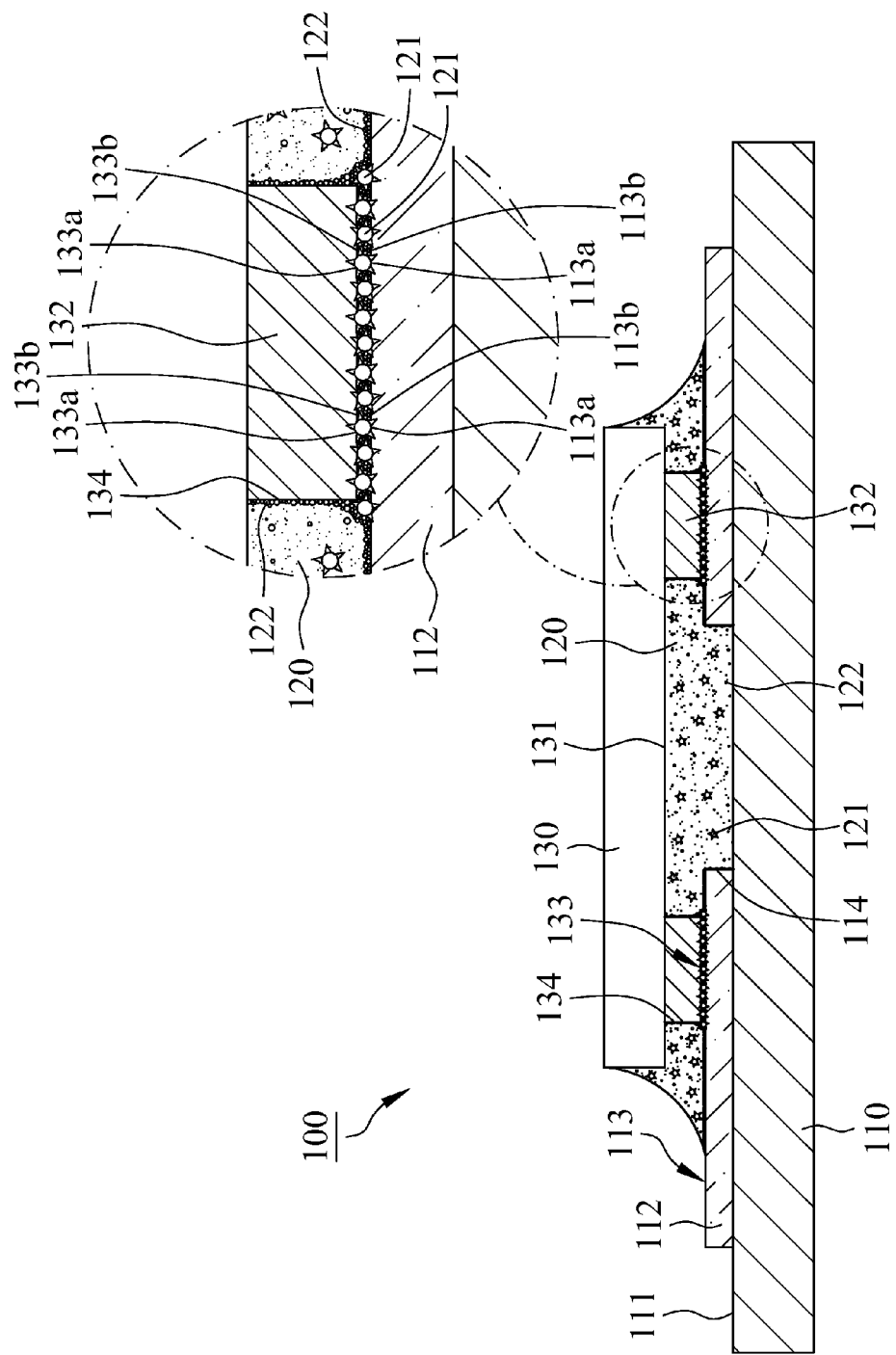

With reference to FIGS. 1A to 1C, a semiconductor packaging method in accordance with a preferred embodiment of the present invention includes the steps as followed. First, referring to FIG. 1A, providing a substrate 110 having an upper surface 111 and a plurality of pads 112 disposed at the upper surface 111, in this embodiment, the pad 112 can be a pin of the substrate 110 or a bump pad of trace lines. Each of the pads 112 comprises a first coupling surface 113 and a lateral surface 114, wherein the first coupling surface 113 comprises a plurality of first conductive contact areas 113a and a plurality of first non-conductive contact areas 113b. Next, referring to FIG. 1B, FIG. 1B indicates forming a conductible gel with anti-dissociation function 120 on the upper surface 111 and the pads 112 of the substrate 110, wherein the conductible gel with anti-dissociation function 120 includes a plurality of conductive particles 121 and a plurality of anti-dissociation substances 122. In this embodiment, the anti-dissociation substance 122 can be an organic solderability preservative, wherein the material of the organic solderability preservative can be chosen from one of benzimidazole or imidazole derivative. Furthermore, the imidazole derivative can be one of Brenzotriazole, Phenylimidazole, Substituted Benzimidazole, Aryl Phonylimidazole or a mixture thereof, and the benzimidazole can be one of Brenzotriazole, Phenylimidazole, Substituted Benzimidazole, Aryl Phonylimidazole or a mixture thereof.

Finally, referring to FIG. 1C, mounting a chip 130 on the substrate 110, said chip 130 comprises an active surface 131 facing toward the upper surface 111 of the substrate 110 and a plurality of copper-containing bumps 132 disposed at the active surface 131. In this embodiment, the material of the copper-containing bumps 132 can be chosen from one of copper/nickel or copper/nickel/gold. The conductible gel with anti-dissociation function 120 covers the copper-containing bumps 132, each of the copper-containing bumps 132 comprises a second coupling surface 133 and a ring surface 134, wherein the second coupling surface 133 comprises a plurality of second conductive contact areas 133a and a plurality of second non-conductive contact areas 133b. The copper-containing bumps 132 are electrically connected with the pads 112 via the conductive particles 121 located between the first coupling surfaces 113 and the second coupling surfaces 133. The conductive particles 121 are electrically connected with the first conductive contact areas 113a of the first coupling surfaces 113 and the second conductive contact areas 133a of the second coupling surfaces 133. The anti-dissociation substances 122 are located between adjacent conductive particles 121, each of the first coupling surfaces 113 and each of the second coupling surfaces 133. The anti-dissociation substances 122 are in contact with the second non-conductive contact areas 133b of the second coupling surfaces 133, and the ring surfaces 134 of the copper-containing bumps 132 are covered with the anti-dissociation substances 122 therefore forming a semiconductor packaging structure 100. Besides, the anti-dissociation substances 122 are in contact with the first non-conductive contact areas 113b of the first coupling surfaces 113 as well. As a result of the ring surfaces 134 of the copper-containing bumps 132 being covered by the anti-dissociation substances 122 of the conductible gel with anti-dissociation function 120, when a dissociation phenomenon via copper ions from the copper-containing bumps 132 is occurred, the anti-dissociation substances 122 may capture those dissociated copper ions in time to avoid short phenomenon from happening and to improve manufacturing yield of the semiconductor packaging structure 100.

With reference to FIG. 1C again, a semiconductor packaging structure 100 in accordance with a preferred embodiment of this invention includes a substrate 110, a conductible gel with anti-dissociation function 120 and a chip 130. The substrate 110 comprises an upper surface 111 and a plurality of pads 112 disposed at the upper surface 111, wherein each of the pads 112 comprises a first coupling surface 113 and a lateral surface 114. The first coupling surface 113 comprises a plurality of first conductive contact areas 113a and a plurality of first non-conductive contact areas 113b. The conductible gel with anti-dissociation function 120 is formed on the upper surface 111 and the pads 112 of the substrate 110, and said conductible gel with anti-dissociation function 120 includes a plurality of conductive particles 121 and a plurality of anti-dissociation substances 122. The chip 130 is mounted on the substrate 110 and comprises an active surface 131 facing toward the upper surface 111 of the substrate 110 and a plurality of copper-containing bumps 132 disposed at the active surface 131. Each of the copper-containing bumps 132 is covered with the conductible gel with anti-dissociation function 120 and comprises a second coupling surface 133 and a ring surface 134, wherein the second coupling surface 133 comprises a plurality of second conductive contact areas 133a and a plurality of second non-conductive contact areas 133b. The copper-containing bumps 132 are electrically connected with the pads 112 via the conductive particles 121 located between the first coupling surfaces 113 and the second coupling surfaces 133. Besides, the conductive particles 121 are electrically connected with the first conductive contact areas 113a of the first coupling surfaces 113 and the second conductive contact areas 133a of the second coupling surfaces 133, wherein the anti-dissociation substances 122 are located between adjacent conductive particles 121, each of the first coupling surfaces 113 and each of the second coupling surfaces 133. The anti-dissociation substances 122 are in contact with the second non-conductive contact areas 133b of the second coupling surfaces 133 and the first non-conductive contact areas 113b of the first coupling surfaces 113. The anti-dissociation substances 122 cover the ring surfaces 134 of the copper-containing bumps 132 and the lateral surfaces 114 of the pads 112.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A semiconductor packaging structure at least includes:
    a substrate having an upper surface and a plurality of pads disposed at the upper surface, each of the pads comprises a first coupling surface having a plurality of first conductive contact areas and a plurality of first non-conductive contact areas;
    a conductible gel with anti-dissociation function formed on the upper surface and the pads of the substrate, said conductible gel with anti-dissociation function includes a plurality of conductive particles and a plurality of anti-dissociation substances; and
    a chip mounted on the substrate, said chip comprises an active surface facing toward the upper surface of the substrate and a plurality of copper-containing bumps disposed at the active surface, each of the copper-containing bumps is covered with the conductible gel with anti-dissociation function and comprises a second coupling surface and a ring surface, said second coupling surface comprises a plurality of second conductive contact areas and a plurality of second non-conductive contact areas, wherein the copper-containing bumps are electrically connected with the pads via the conductive particles located between the first coupling surfaces and the second coupling surfaces, said conductive particles are electrically connected with the first conductive contact areas of the first coupling surfaces and the second conductive contact areas of the second coupling surfaces, wherein the anti-dissociation substances are located between adjacent conductive particles, each of the first coupling surfaces and each of the second coupling surfaces, said anti-dissociation substances are in contact with the second non-conductive contact areas of the second coupling surfaces, and the ring surfaces of the copper-containing bumps are covered with the anti-dissociation substances.

2. The semiconductor packaging structure in accordance with claim 1, wherein the anti-dissociation substances are in contact with the first non-conductive contact areas of the first coupling surfaces.

3. The semiconductor packaging structure in accordance with claim 1, wherein each of the pads comprises a lateral surface being covered with the anti-dissociation substances.

4. The semiconductor packaging structure in accordance with claim 1, wherein the anti-dissociation substance can be an organic solderability preservative.

5. The semiconductor packaging structure in accordance with claim 4, wherein the material of the organic solderability preservative can be chosen from one of benzimidazole or imidazole derivative.

6. The semiconductor packaging structure in accordance with claim 5, wherein the imidazole derivative can be one of Brenzotriazole, Phenylimidazole, Substituted Benzimidazole, Aryl Phonylimidazole or a mixture thereof, and the benzimidazole can be one of Brenzotriazole, Phenylimidazole, Substituted Benzimidazole, Aryl Phonylimidazole or a mixture thereof.

7. The semiconductor packaging structure in accordance with claim 1, wherein the material of the copper-containing bumps can be chosen from one of copper/nickel or copper/nickel/gold.

* * * * *